(12) United States Patent
Aimoto et al.

(10) Patent No.: US 6,359,825 B1
(45) Date of Patent: Mar. 19, 2002

(54) DYNAMIC MEMORY WITH INCREASED ACCESS SPEED AND REDUCED CHIP AREA

(75) Inventors: Yoshiharu Aimoto; Tohru Kimura; Koichi Takeda, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/428,712

(22) Filed: Oct. 28, 1999

(30) Foreign Application Priority Data

Oct. 28, 1998 (JP) .......................................... 10-306450

(51) Int. Cl.[7] .................................................. G11C 8/00
(52) U.S. Cl. .................. 365/230.03; 365/149; 365/205; 365/208
(58) Field of Search ................................ 365/191, 205, 365/208, 230.03, 189.01, 230.01, 149, 129

(56) References Cited

U.S. PATENT DOCUMENTS

| 5,500,820 A | * | 3/1996 | Nakaoka et al. ........ 365/189.01 |
| 5,719,815 A | * | 2/1998 | Takahashi et al. .......... 365/222 |
| 5,870,344 A | * | 2/1999 | Ozawa ....................... 365/205 |
| 5,953,282 A | * | 9/1999 | Jung et al. ............. 365/230.05 |

FOREIGN PATENT DOCUMENTS

| JP | 1-229492 | 9/1989 |
| JP | 3-283186 | 12/1991 |
| JP | 4-30388 | 2/1992 |
| JP | 4-216394 | 8/1992 |
| JP | 5-74143 | 3/1993 |

* cited by examiner

Primary Examiner—David Nelms
Assistant Examiner—Hoai V. Ho
(74) Attorney, Agent, or Firm—Hutchins, Wheeler & Dittmar

(57) ABSTRACT

A dynamic memory including a first sense amplifier circuit directly connected to a bit line of a memory cell, a second sense amplifier directly connected to a data input/output circuit, a switching circuit connected between the first sense amplifier circuit and the second sense amplifier circuit. In a reading operation, the switching circuit is controlled to separate the first sense amplifier circuit and the second sense amplifier circuit from each other after data is read out from the memory cell, so that the read-out data is amplified by the second sense amplifier circuit and outputted from the second sense amplifier circuit to an external of the memory. On the other hand, the first sense amplifier circuit amplifies the read-out data and writes back the read-out data to the memory cell. In the writing operation, the switching circuit is controlled to interconnect the first sense amplifier circuit and the second sense amplifier circuit to each other, so that data to be written from an external is written into the memory cell through the first and second sense amplifier circuits.

12 Claims, 7 Drawing Sheets

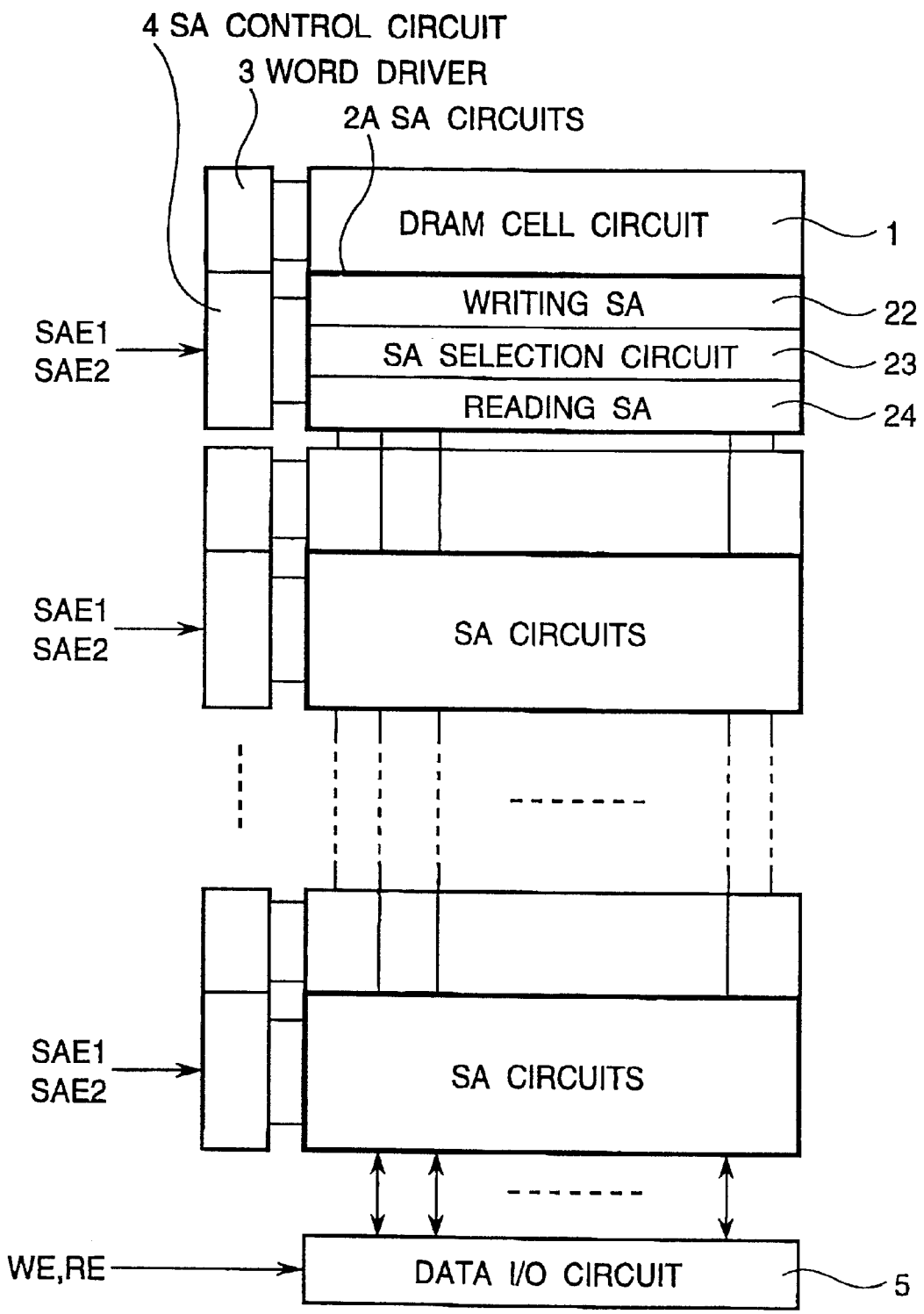

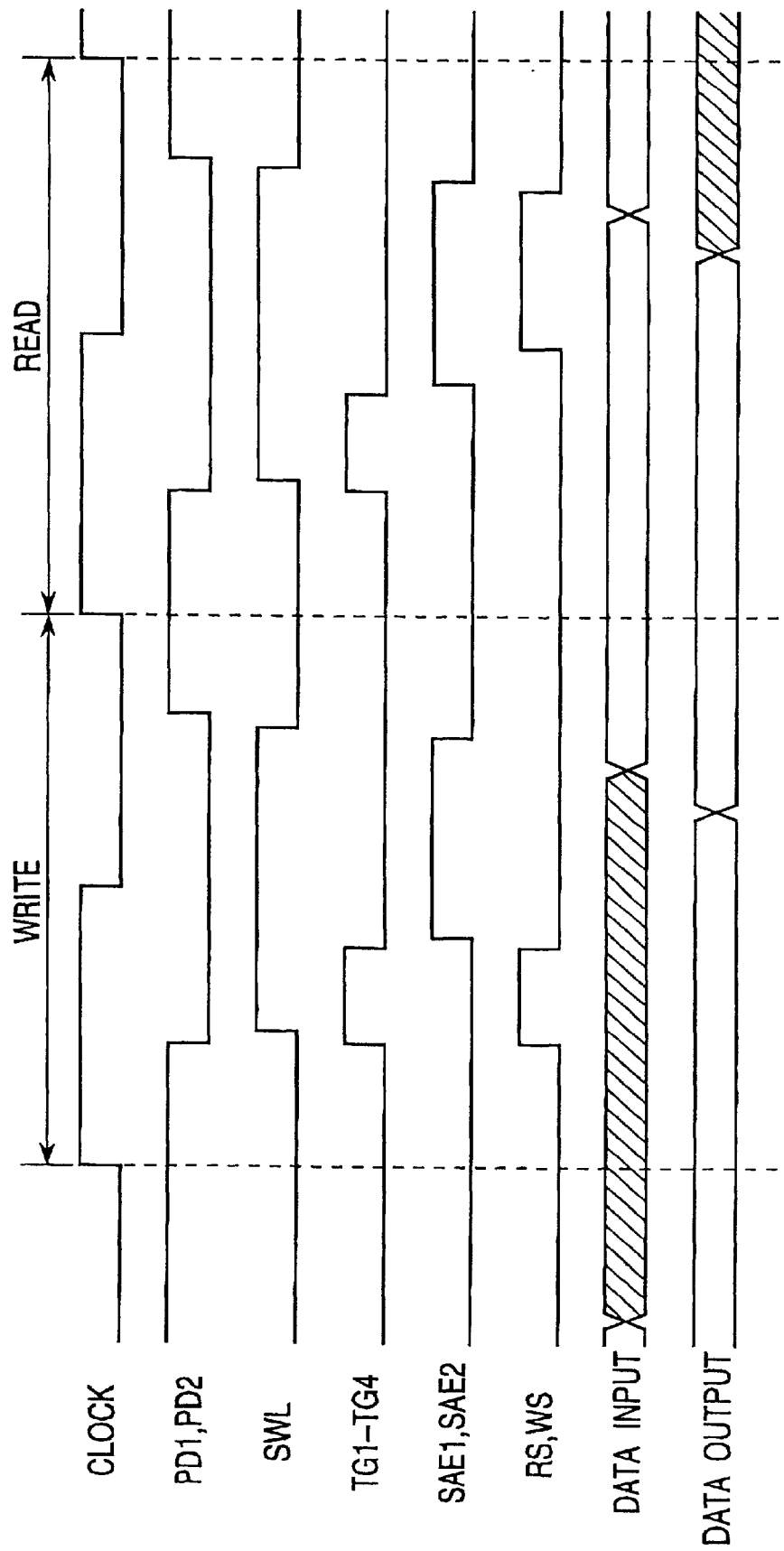

DYNAMIC MEMORY WITH INCREASED ACCESS SPEED AND REDUCED CHIP AREA

BACKGROUND OF THE INVENTION

1. Field of the Invention

The present invention relates to a dynamic memory, and more specifically to a dynamic memory having an increased access speed and an increased cycle speed and a reduced chip area of a timing control circuit incorporated in a memory chip and a reduced power consumption of the memory chip.

2. Description of Related Art

Referring to FIGS. 4A and 4B, a circuit construction of a conventional DRAM (dynamic random access memory). FIG. 4A is a block diagram illustrating the construction of the conventional DRAM, and FIG. 4B is a circuit diagram illustrating a detailed circuit construction of one memory cell circuit set composed of a DRAM cell circuit and associated sense amplifier circuits, included in the conventional DRAM.

As shown in FIG. 4A, the conventional DRAM includes a plurality of memory cell circuit sets each of which includes a DRAM cell (memory cell) circuit 1 and associated SA (sense amplifier) circuits 2. The plurality of memory cell circuit sets are arranged in the form of an array. Each of the DRAM cell circuit 1 is associated with a word driver 3, and the SA circuits 2 associated to each DRAM cell circuit are associated with a SA (sense amplifier) driver 4, which is supplied with a SA (sense amplifier) enable signal SAE.

In common to all the memory cell circuit sets each composed of the DRAM cell circuit 1 and the associated sense amplifier circuits 2, a SA (sense amplifier) selection circuit 6, a DA (data amplifier) circuit 7 and a data input/output circuit 5 are provided. The DA circuit 7 receives a DA (data amplifier) control signal DAE, and the data input/output circuit 5 receives a write enable signal WE and a read enable signal RE.

Referring to FIG. 4B which is a detailed circuit diagram of the first memory cell circuit set of the DRAM cell circuit 1 and the associated sense amplifier circuits 2, the DRAM cell circuit 1 includes a plurality of word lines SWL (only two word lines SWL1 and SWL2 are shown for simplification of the drawing), and a plurality of pairs of bit lines BL and $\overline{BL}$. At each of intersections between the word lines and the bit lines, a DRAM memory cell 11 is located and connected to a corresponding word line and a corresponding bit line. One SA circuit 2 is provided for each bit line pair, and it is an ordinary practice in an integrated circuit layout that the SA circuits 2 are located at an upper side and at a lower side of the DRAM cell circuit 1, in symmetry to the DRAM cell circuit 1. In the drawing, however, a detailed circuit diagram of only the lower side SA circuits is shown for avoiding complication of the drawing.

The SA circuit 2 includes a sense amplifier 21 having a pair of (input/output) terminals connected to a corresponding pair of bit lines BL and $\overline{BL}$, a read switch 25 having a pair of input terminals connected to the corresponding pair of bit lines BL and $\overline{BL}$ and a pair of output terminals connected to a pair of output terminals OL and $\overline{OL}$, a write switch 26 having a pair of input terminals connected to a pair of input terminals IL and $\overline{IL}$ and a pair of output terminals connected to the corresponding pair of bit lines BL and $\overline{BL}$, and a precharge equalizer 27 for precharging and equalizing the corresponding pair of bit lines BL and $\overline{BL}$. The precharge equalizer 27 is connected to a half power supply voltage HVCC (=VCC/2) and controlled by a precharge equalize signal PDL. Each sense amplifier 21 is connected to a pair of sense amplifier power supply voltages SAN and SAP. Each read switch 25 is controlled by a corresponding read signal RSi (i=1 to 4), and each write switch 26 is controlled by a corresponding write switch WSi (i=1 to 4).

Referring to FIG. 5, there is shown a timing chart for illustrating an actual operation of the conventional DRAM shown in FIGS. 4A and 4B. Now, a reading operation will be described. First, one word line SWL (SWL1, SWL2, etc.) is selected, so that data is read out from each of the memory cells 11 connected to the selected word line, to a corresponding bit line pair. Then, the SA circuit is enabled by the SA enable signal SAE, so that the data is written back to the memory cell, and the data of the SA circuit selected by the read signal RS (RS1, RS2, RS3, RS4 etc.) by action of the SA selection circuit 6 is transferred to the DA circuit 7. The DA circuit 7 is enabled by the DA control signal DAE, so that the data is amplified again. The amplified data is outputted to the data input/output circuit 5, and finally, the data is outputted from the data input/output circuit 5 to a device external to the memory.

In the above mentioned operation, the read signal RS is required to be supplied after the signal on the bit line pair has sufficiently been amplified. However, since a capacitance and a resistance of the bit line pair are large, it is necessary to insert a time difference between the activation of the SA enable signal SAE and the inputting of the read signal RS.

Next, a writing operation will be described. Data supplied through the data input/output circuit 5 is amplified by the DA circuit 7 enabled by the DA control signal DAE, and transferred to the SA circuit selected by the write signal WS (WS1, WS2, WS3, WS4 etc.) by action of the SA selection circuit 6. Data is written into the DRAM cell 11 by forcibly rewriting the data in the SA circuit by the data supplied from the DA circuit 7. Accordingly, the operating sequence of the SA circuit and the DA circuit is required to be reversed from the data reading operation to the data writing operation, and therefore, the control circuit for operating the DRAM becomes complicated.

A first problem in the above mentioned conventional DRAM is that a high speed access cannot be obtained. The reason for this is that since the capacitance and the resistance of the bit line are large, it is necessary to insert a time difference between the activation of the SA enable signal SAE and the inputting of the read signal RS.

A second problem in the above mentioned conventional DRAM is that the timing control circuit for the reading/writing operation is complicated, with the result that the access speed, the chip area and the power consumption are inevitably increased. The reason for this is that, in the memory including the SA circuit and the DA circuit, the activation sequence of the SA circuit and the DA circuit is required to be changed from the data reading operation to the data writing operation.

SUMMARY OF THE INVENTION

Accordingly, it is an object of the present invention to provide a dynamic random access memory which has overcome the above mentioned problems of the conventional one.

Another object of the present invention is to speed up the data reading and writing operation in a dynamic random access memory, and to reduce the area of a timing control circuit incorporated in the dynamic random access memory and the power consumption of the dynamic random access memory, thereby to provide a high-speed, low power consumption, inexpensive dynamic random access memory.

The above and other objects of the present invention are achieved in accordance with the present invention by a dynamic memory including a first sense amplifier circuit directly connected to a bit line of a memory cell, a second sense amplifier directly connected to a data input/output circuit, a switching circuit connected between the first sense amplifier circuit and the second sense amplifier circuit, and a control means for controlling the switching circuit to separate the first sense amplifier circuit and the second sense amplifier circuit from each other after data is read out from the memory cell, so that the read-out data is amplified by the second sense amplifier circuit and outputted from the second sense amplifier circuit to an external of the memory.

Furthermore, the read-out data is amplified and written back to the memory cell by the first sense amplifier circuit. In a writing operation, the control means controls the switching circuit to interconnect the first sense amplifier circuit and the second sense amplifier circuit to each other, so that data to be written from an external is written into the memory cell through the first and second sense amplifier circuits.

Preferably, the control means is so configured to generate various control signals for the first and second sense amplifier circuits used in the reading operation, at the same timings as timings of various control signals for the first and second sense amplifier circuits used in the writing operation. In addition, in the writing operation, a predetermined logic level is written into only one of a pair of terminals of the first sense amplifier circuit. Furthermore, one second sense amplifier circuit is provided in common to a plurality of first sense amplifier circuits.

With the above mentioned arrangement, the first and second sense amplifier circuits are provided for the bit line connected to the memory cell, so that the sense amplifier used for the writing operation of the memory cell is separated from the sense amplifier used for the reading operation for outputting data from the memory cell to the external, with the result that a load on respective input/output terminals of the first and second sense amplifier circuits are reduced. Therefore, the high speed reading and writing become possible.

In addition, in the writing operation, the data supplied through the external is caused to pass through the second sense amplifier circuit and to be amplified by the first sense amplifier circuit so that the amplified data is written into the memory cell. As a result, the timings of various control signals for the first and second sense amplifier circuits can be made to be the same in both the reading operation and in the writing operation. Therefore, it is possible to reduce the area of the timing control circuits incorporated in the memory chip and the power consumption of the memory chip.

The above and other objects, features and advantages of the present invention will be apparent from the following description of preferred embodiments of the invention with reference to the accompanying drawings.

BRIEF DESCRIPTION OF THE DRAWINGS

FIG. 1A is a block diagram illustrating the construction of an embodiment of the DRAM in accordance with the present invention;

FIG. 2 is a timing chart for illustrating an actual operation of the embodiment of the DRAM in accordance with the present invention;

DESCRIPTION OF THE PREFERRED EMBODIMENTS

Now, an embodiment of the dynamic memory in accordance with the present invention will be described with reference to the drawings.

Figure 1B:
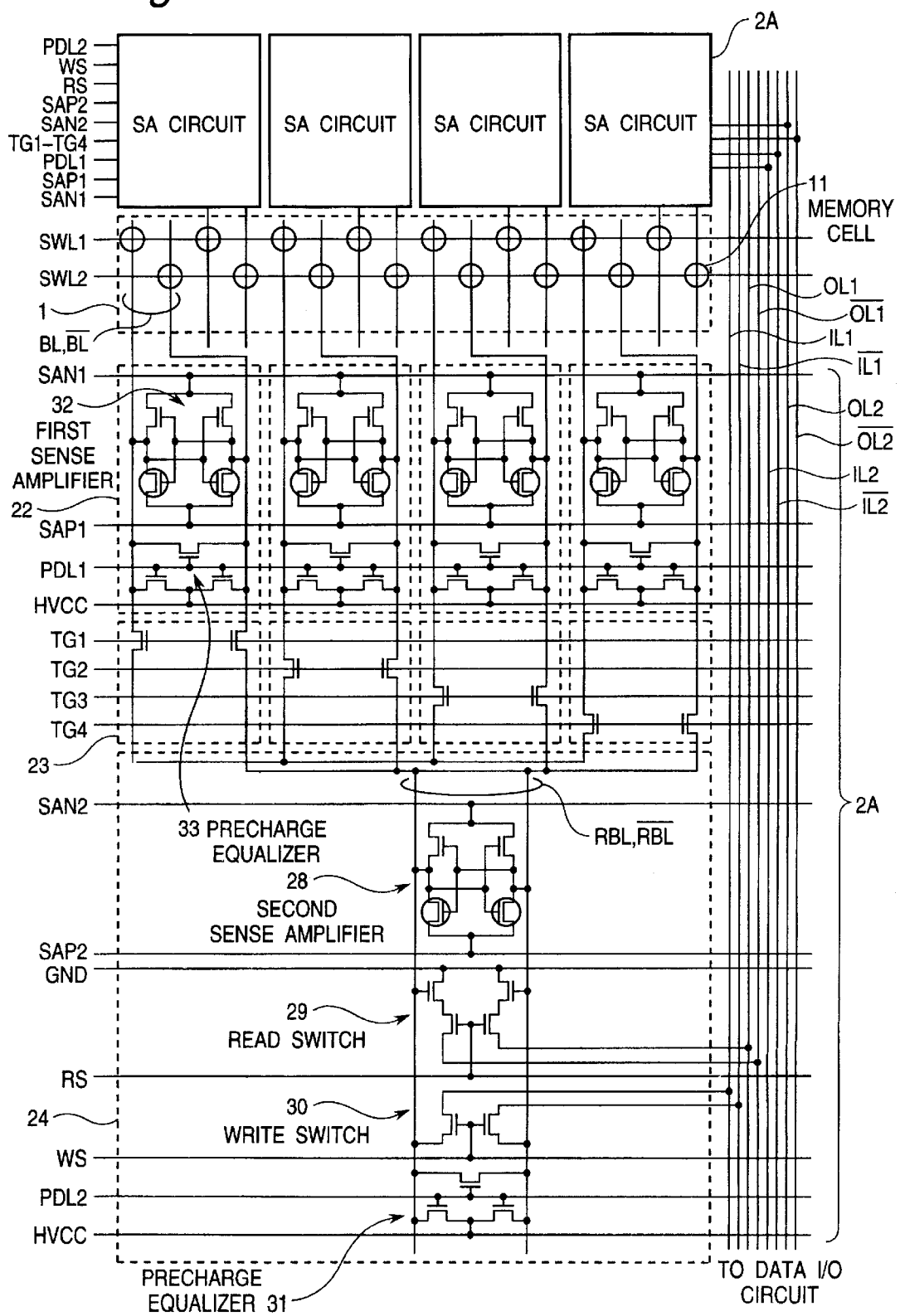
FIG. 1B is a circuit diagram illustrating a detailed circuit construction of one memory cell circuit set composed of a DRAM cell circuit and associated sense amplifier circuits, included in the embodiment of the DRAM in accordance with the present invention.
Figure 4A:
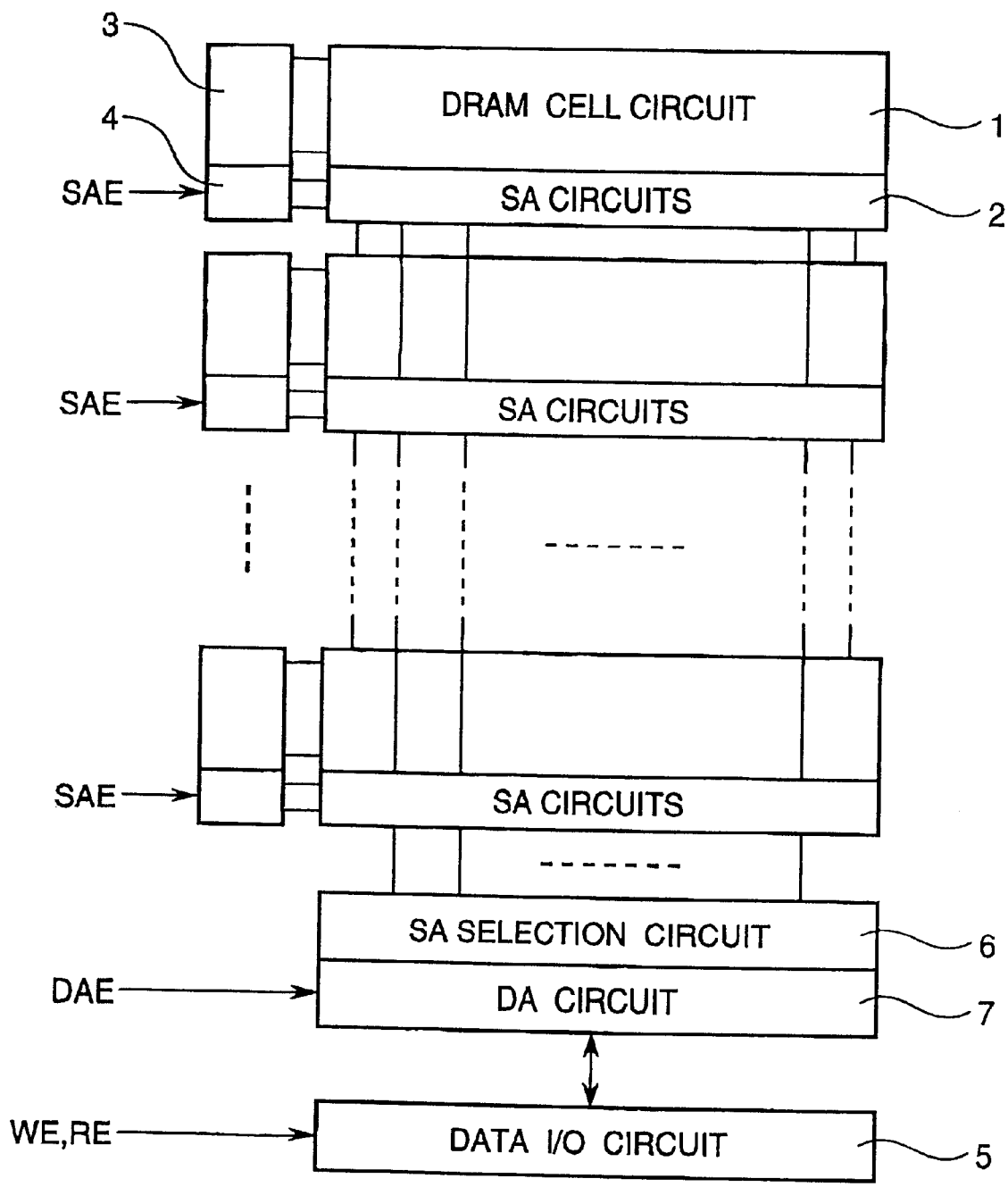
FIG. 4A is a block diagram illustrating the construction of the conventional DRAM.
Figure 4B:
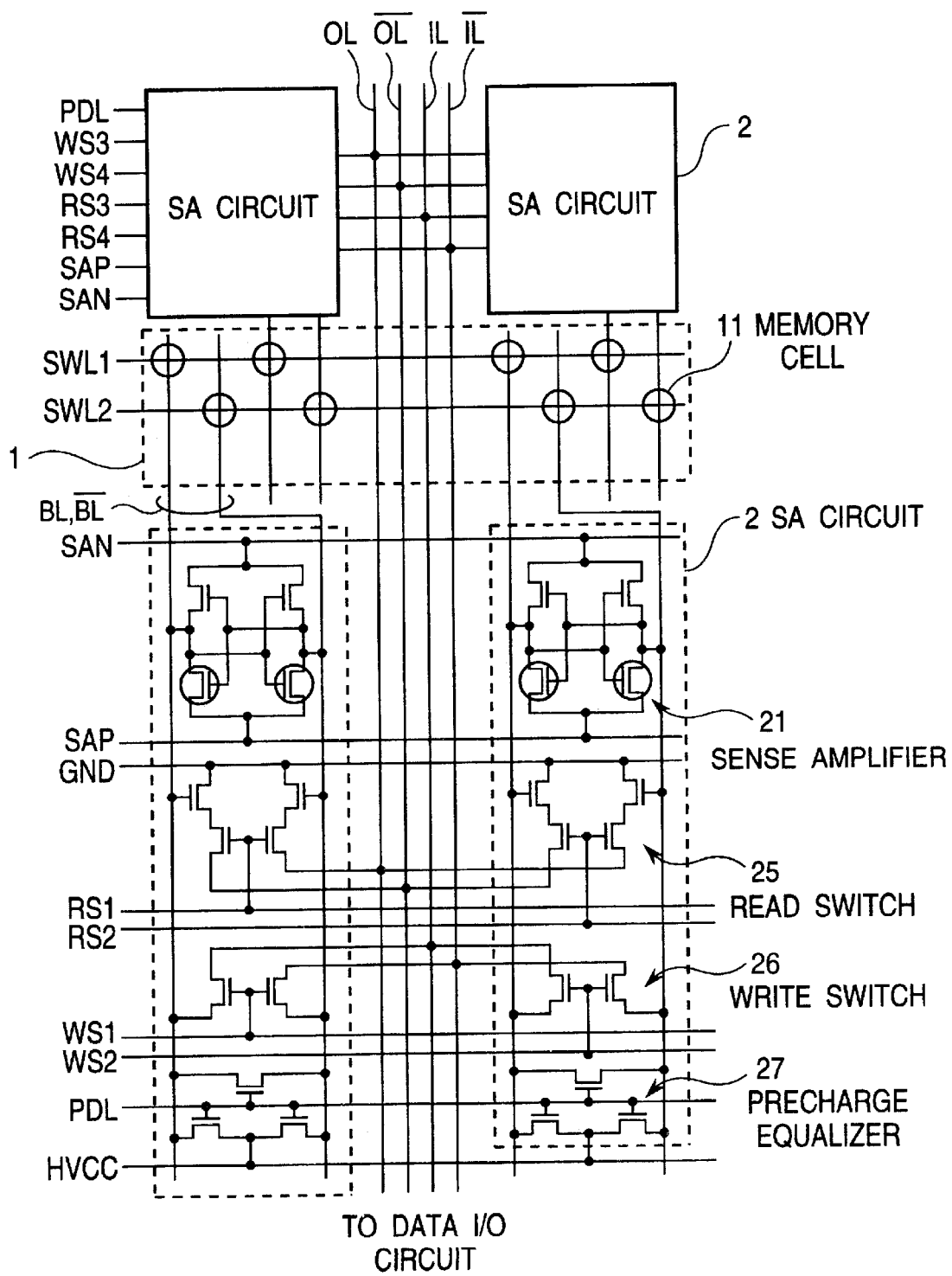
FIG. 4B is a circuit diagram illustrating a detailed circuit construction of one memory cell circuit set composed of a DRAM cell circuit and associated sense amplifier circuits, included in the conventional DRAM.
Figure 5:
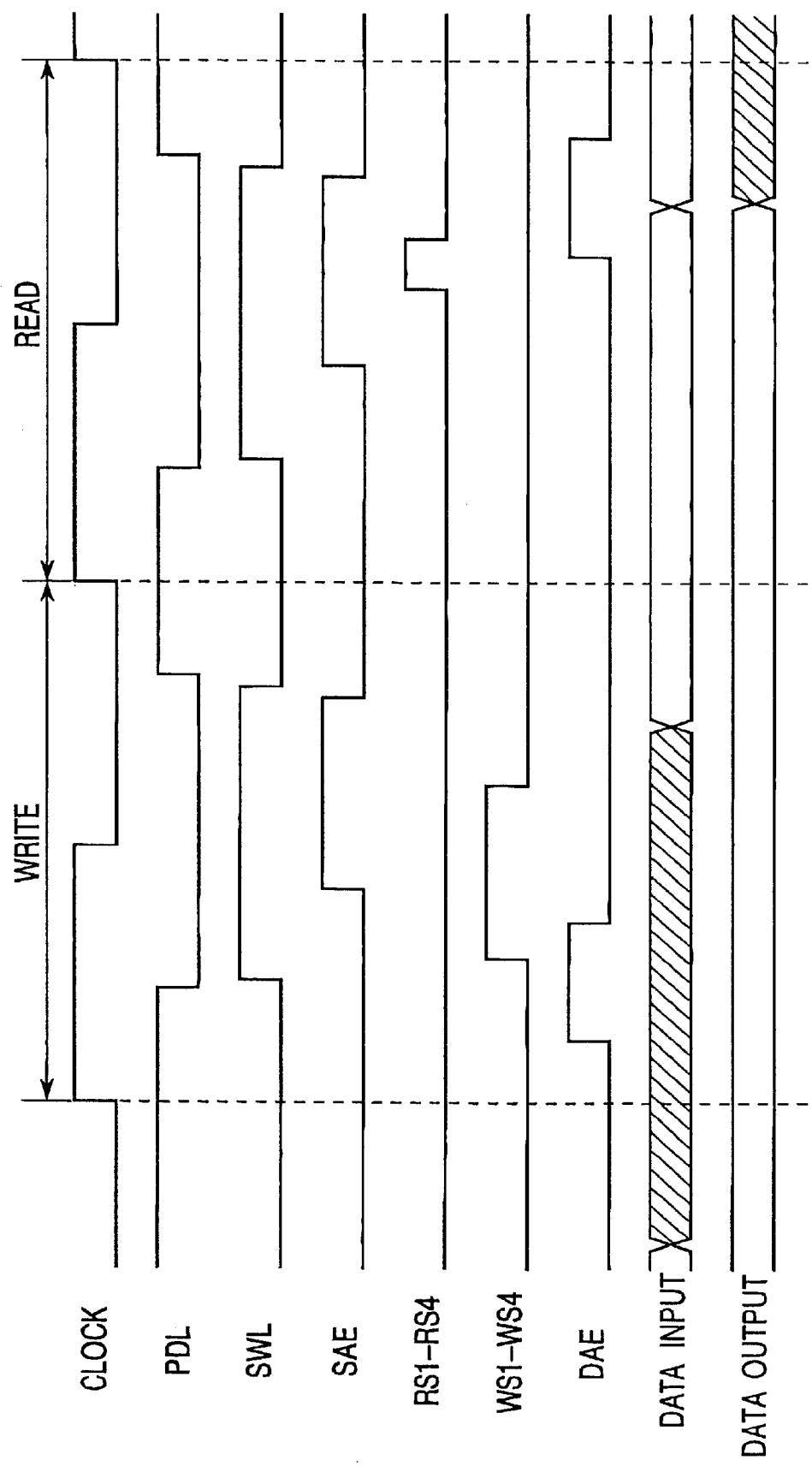
FIG. 5 is a timing chart for illustrating an actual operation of the conventional DRAM shown in FIGS. 4A and 4B.

FIG. 1A is a block diagram illustrating the construction of an embodiment of the DRAM in accordance with the present invention, and FIG. 1B is a circuit diagram illustrating a detailed circuit construction of one memory cell circuit set composed of a DRAM cell circuit and associated sense amplifier circuits, included in the embodiment of the DRAM in accordance with the present invention. In FIGS. 1A and 1B, elements corresponding to those shown in FIGS. 4A and 4B are given the same reference numbers.

As shown in FIG. 1A, the shown DRAM includes a plurality of memory cell circuit sets arranged in the form of an array, each of the memory cell circuit sets including a DRAM cell circuit 1 and associated SA (sense amplifier) circuits 2A. Each of the DRAM cell circuits 2A is associated with a word driver 3, and each of the SA circuits 2A is associated with a SA (sense amplifier) control circuit 4A, which is supplied with a writing SA (sense amplifier) enable signal SAE1 and a reading SA enable signal SAE2.

In common to all the memory cell circuit sets each composed of the DRAM cell circuit 1 and the associated sense amplifier circuits 2A, a data input/output circuit 5 is provided, which receives a write enable signal WE and a read enable signal RE. Each of the SA circuits 2A includes a writing SA (sense amplifier) section 22, a SA (sense amplifier) selection circuit 23 and a reading SA (sense amplifier) section 24.

Referring to FIG. 1B which is a detailed circuit diagram of the first memory cell circuit set of the DRAM cell circuit 1 and the associated sense amplifier circuits 2A, the DRAM cell circuit 1 includes a plurality of word lines SWL (only two word lines SWL1 and SWL2 are shown for simplification of the drawing), and a plurality of pairs of bit lines BL and $\overline{BL}$. At each of intersections between the word lines and the bit lines, a DRAM memory cell 1 is located and connected to a corresponding word line and a corresponding bit line. One SA circuit 2A is provided for each bit line pair, and it is an ordinary practice in an integrated circuit layout that the SA circuits 2A are located at an upper side and at a lower side of the DRAM cell circuit 1, in symmetry to the DRAM cell circuit 1. In the drawing, however, a detailed circuit diagram of only the lower side SA circuits is shown for avoiding complication of the drawing.

Each writing SA section 22 is connected directly to a corresponding pair of bit lines BL and $\overline{BL}$ in the DRAM cell circuit 1, and includes a first sense amplifier 32 having a pair of (input/output) terminals connected to the corresponding pair of bit lines BL and $\overline{BL}$ and a precharge equalizer 33 for precharging and equalizing the corresponding pair of bit lines BL and $\overline{BL}$.

The reading SA section 24 is provided in common to a plurality of writing SA sections 22. This reading SA section 24 includes a second sense amplifier 28 having a pair of (input/output) terminals connected to a pair of reading bit lines RBL and $\overline{RBL}$, and a read switch 29, a write switch 30 and a precharge equalizer 31 each having a pair of terminals connected to the pair of reading bit lines RBL and $\overline{RBL}$, respectively.

The SA selection circuit 23 is located between the plurality of writing SA sections 22 and the reading SA section 24, for separating and interconnecting between the plurality of writing SA sections 22 and the reading SA section 24. The SA selection circuit 23 includes a number of transfer gates controlled by transfer gate control signals TG1, TG2, TG3 and TG4, respectively. Specifically, the pair of (input/output) terminals of the second sense amplifier 28, namely, the pair of reading bit lines RBL and $\overline{RBL}$ are connected through a first pair of transfer gates controlled by the transfer gate control signal TG1 to a first pair of bit lines BL and $\overline{BL}$ in the DRAM cell circuit 1, respectively. Furthermore, the pair of reading bit lines RBL and $\overline{RBL}$ are connected through a second pair of transfer gates controlled by the transfer gate control signal TG2 to a second pair of bit lines in the DRAM cell circuit 1, respectively. The pair of reading bit lines RBL and $\overline{RBL}$ are also connected through a third pair of transfer gates controlled by the transfer gate control signal TG3 to a third pair of bit lines in the DRAM cell circuit 1, respectively. The pair of reading bit lines RBL and $\overline{RBL}$ are also connected through a fourth pair of transfer gates controlled by the transfer gate control signal TG4 to a fourth pair of bit lines in the DRAM cell circuit 1, respectively.

A pair of outputs of the read switch 29 included in the reading SA section 24 are connected through a pair of output data lines OL1 and $\overline{OL1}$ or OL2 and $\overline{OL2}$ to the data input/output circuit 5. The read switch 29 is controlled by the read signal RS. On the other hand, an input data from the data input/output circuit 5 through a pair of input data lines IL1 and $\overline{IL1}$ or IL2 and $\overline{IL2}$ is supplied to a pair of inputs of the write switch 30. The write switch 30 is controlled by the write signal WS. The precharge equalizer 33 is controlled by a precharge equalize signal PDL1 and the precharge equalizer 31 is controlled by a precharge equalize signal PDL2. The above mentioned various control signals RS, WS, PDL1, PDL2, TG1, TG2, TG3 and TG4 are generated by the SA control circuit 4A.

Referring to FIG. 2, there is shown a timing chart for illustrating an actual operation of the embodiment of the DRAM in accordance with the present invention. Now, a reading operation will be described. First, after the precharge has been completed, namely, when the precharge equalize signals PDL1 and PD12 are deactivated, a pair of bit lines to be connected to the reading SA section 24 is selected by action of the SA selection circuit 23 by selectively activating one of the transfer gate control signals TG1 to TG4. Thereafter, one word line SWL (SWL1, SWL2, etc.) is selectively driven by the word driver 3, so that data is read out from the memory cell 11 connected to the selected word line, to a corresponding pair of bit lines BL and $\overline{BL}$ in the DRAM cell circuit 1 and further through the SA selection circuit 23 to the pair of reading bit lines RBL and $\overline{RBL}$. Then, the pair of bit lines BL and $\overline{BL}$ in the DRAM cell circuit 1 are separated from the pair of reading bit lines RBL and $\overline{RBL}$ by action of the SA selection circuit 23 by putting all of the transfer gate control signals TG1 to TG4 in a deactivated condition. Thereafter, the writing SA circuits 22 and the reading SA section 24 are enabled by the writing SA enable signal SAE1 and the reading SA enable signal SAE2, respectively, so that the data is written back to the memory cell by action of the writing SA circuit 22, and on the other hand, the data is outputted from the reading SA section 24 to the data input/output circuit 5 by activating the read signal RS, and finally, the data is outputted from the data input/output circuit 5 to a device external to the memory.

In the above mentioned operation, since the bit line pair having large capacitance and resistance and the reading SA section 24 having a small load are driven separately from each other, it is possible to make small the time difference inserted between the activation of the reading SA enable signal SAE2 and the activation of the read signal RS.

Next, a writing operation will be described. First, after the precharge has been completed, namely, when the precharge equalize signals PDL1 and PDL2 are deactivated, the write signal WS is activated, and a pair of bit lines connected to a memory cell to be written are selectively connected to the reading SA section 24 by action of the SA selection circuit 23 by selectively activating one of the transfer gate control signals TG1 to TG4. In this condition, data supplied through the data input/output circuit 5 is transferred through the reading SA section 24 to the writing SA section 22 selected by the SA selection circuit 23.

Thereafter, one word line SWL (SWL1, SWL2, etc.) connected to the memory cell to be written is selectively driven by the word driver 3. Then, the write signal WS is deactivated, and the writing SA section 22 are separated from the reading SA section 24 by action of the SA selection circuit 23 by putting all of the transfer gate control signals TG1 to TG4 in a deactivated condition. Thereafter, the writing SA circuits 22 and the reading SA section 24 are enabled by the writing SA enable signal SAE1 and the reading SA enable signal SAE2, respectively, so that the data supplied through the data input/output circuit 5 is amplified by the first sense amplifier 32, and written into the memory cell selected by the word line. In this operation, the data read out of the DRAM cell 11 is forcibly rewritten with the data supplied from the data input/output circuit 5.

In the operation executed in the above mentioned timing, as shown in FIG. 2, the timings of various control signals excluding the reading signal RS, used in the reading operation can be controlled at the same timings as the timings of various control signals excluding the write signal WS, used in the writing operation.

Figure 3A:
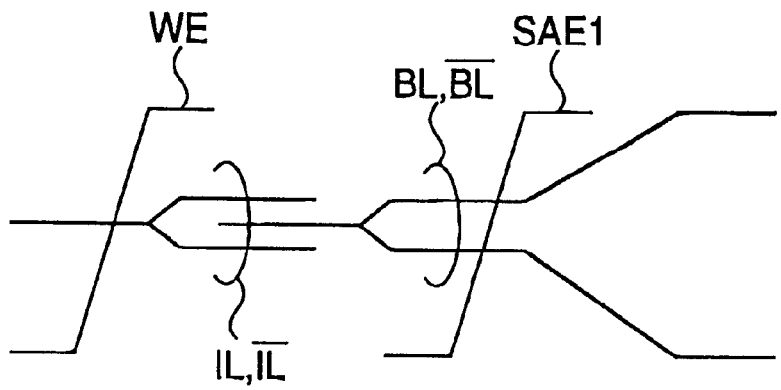
FIGS. 3A, 3B and 3C are waveform diagrams illustrating different modes of the writing operation in the embodiment of the DRAM in accordance with the present invention.
Figure 3B:
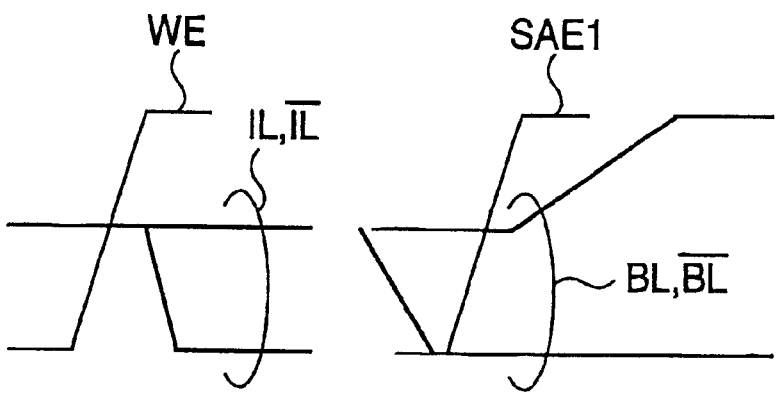
Figure 3C:
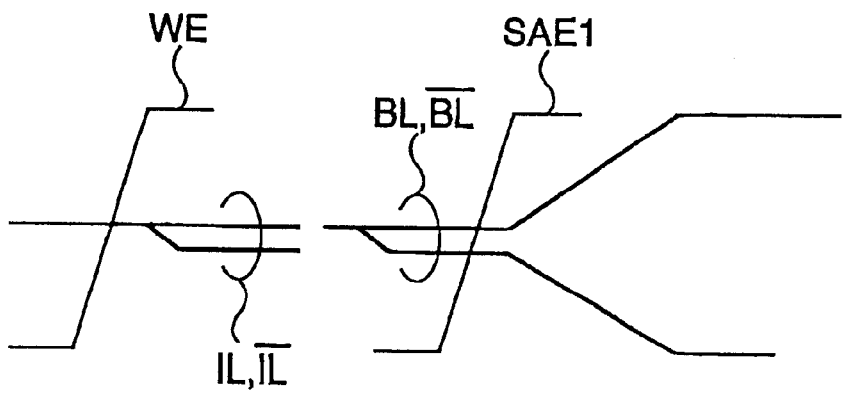

In the writing operation of the prior art, since the writing is forcibly executed after the sense amplifier is activated, the writing was executed with a power supply voltage. In the present invention, on the other hand, since data is transferred to the bit line pair in the DRAM cell circuit before the sense amplifier is activated, it is possible to execute the writing with a small signal, as shown in FIG. 3A. Furthermore, it is possible to execute the writing by bringing only one of a pair of complementary signals to a low level, as shown in FIG. 3B. In this case, it is also possible to bring the writing level to a small signal as shown in FIG. 3C. This arrangement can reduce the power consumption in the writing operation.

As seen from the above, the present invention has a first advantage in that the reading and writing operation can be speeded up. The reason for this is that since the first and second sense amplifiers are provided to the bit line pair connected to the memory cell, and since the sense amplifier for writing the memory cell and the sense amplifier for outputting the read-out data to the external are separated from each other, the load of the terminals of the first and second sense amplifiers can be reduced.

Furthermore, the present invention has a second advantage in that the area of the timing control circuit incorporated in the integrated circuit chip and the power consumption can be reduced. The reason for this is that, in the writing operation, since the data supplied from the external is caused to pass through the second sense amplifier and to be amplified by the first sense amplifier so that the data is written, the timings of various control signals used for controlling the first and second sense amplifiers can be made the same in both the reading operation and the writing operation.

In addition, the present invention has a third advantage capable of reducing the power consumption in the writing operation. The reason for this is that when write data is supplied to the pair of input/output terminals of the first sense amplifier, it is possible to supply a low level signal or a small low level signal as only one of a pair of signals supplied to the pair of input/output terminals.

The invention has thus been shown and described with reference to the specific embodiments. However, it should be noted that the present invention is in no way limited to the details of the illustrated structures but changes and modifications may be made within the scope of the appended claims.

What is claimed is:

1. A dynamic memory having a memory array that includes a plurality of memory blocks that have a plurality of memory cells, each one of the plurality of memory blocks including a plurality of first sense amplifier circuits directly connected to bit lines, and a second sense amplifier directly connected to a data input/output circuit shared by the first sense amplifiers of each of the memory blocks, at least a switching circuit connected between the first sense amplifier circuits and the second sense amplifier circuit, and a control means for controlling the switching circuit to separate the first sense amplifier circuits and the second sense amplifier circuit from each other after data is read out from a selected individual one memory cell of the plurality of memory cells, so that the read-out data is amplified by tho second sense amplifier circuit and outputted from the second sense amplifier circuit to a common external connection or the dynamic memory.

2. The dynamic memory as claimed in claim 1 wherein each of said plurality of first sense amplifier circuits at least amplifies the read-out data and writes back the read-out data to the same individual one of the plurality of memory cells from which said data is read out after said control means separate each of said plurality of first sense amplifier circuits and the second amplifier circuit from each other.

3. The dynamic memory as claimed in claim 2 wherein, during a writing operation, said control means controls the switching circuit to interconnect one of said first sense amplifier circuits and said second sense amplifier circuit of one of the plurality of memory cells to each other, so that data to be written to the selected individual one of the plurality of memory cells during the writing operation from an external connection is written into the memory cell through both the first and second sense amplifier circuits.

4. The dynamic memory as claimed in claim 3 wherein said control means generate a plurality of control signals for the first and second sense amplifier circuits used in the reading operation wherein a timing of the plurality of control signals for the reading operation is the same timing as timings of a plurality of control signals for the first and second sense amplifier circuits used in the writing operation.

5. The dynamic memory as claimed in claim 1 wherein, during a writing operation, said control means controls the switching circuit to interconnect one of said first sense amplifier circuits and said second sense amplifier circuit of one of the plurality of memory cells to each other, so that data to be written to the selected individual one of the plurality of memory cells during the writing operation from an external connection is written into the memory cell through both the first and second sense amplifier circuits.

6. The dynamic memory as claimed in claim 1 wherein said control means generate a plurality of control signals for the first and second sense amplifier circuits used in the reading operation wherein a timing of the plurality of control signals for the reading operation is the same timing as timings of a plurality of control signals for the first and second sense amplifier circuits used in the writing operation.

7. The dynamic memory as claimed in claim 1 wherein during the writing operation, a predetermined logic level is written into only one of a pair of terminals of the first sense amplifier circuit of one of the plurality of memory cells.

8. The dynamic memory as claimed in claim 1 wherein one second sense amplifier circuit is provided in common to a plurality of first sense amplifier circuits, each of the first sense amplifier circuits being associated with at least one of the plurality of memory cells.

9. A dynamic memory comprising:

a memory array that includes a plurality of memory blocks comprised of a plurality of memory cells;

each one of the plurality of memory blocks further including;

a plurality of first sense amplifier circuits each being communicatively connected to at least one bit line of an individual one of the memory blocks;

the dynamic memory further including at least one second sense amplifier circuit communicatively connected to at least one data input/output circuit of at least one of the plurality of memory cells, wherein the first sense amplifiers of each memory block share the second sense amplifier;

at least one switching circuit connected between the first sense amplifier circuits and said second sense amplifier circuit;

a control circuit for switching the at least one switching circuit to separate at least some of the first sense amplifier circuits from said second sense amplifier circuit after a data read out operation is performed on the memory cell;

the data read out operation providing a data value to said second sense amplifier circuit; and the selected second amplifier circuit that is separated from the first sense amplifier circuits after a data read out operation, then amplifies the data value and communicatively connects the data value to an eternal connection of the dynamic memory that is connected to at least some of the plurality of memory cells of the dynamic memory.

10. The dynamic memory as claimed in claim 9, wherein each individual one of the at least one second sense amplifier circuits is communicatively connected to a plurality of first sense amplifier circuits.

11. The dynamic memory as claimed in claim 10, wherein each individual one of the second sense amplifier circuits is communicatively connected to a row of contiguous ones of the first amplifier circuits.

12. The dynamic memory as claimed in claim 9, wherein at least one of the first sense amplifier circuits communicatively connected to at least one bit line or the memory cell amplifies the read out operation data value and writes back the read out operation data value to the same one of the plurality of memory cells.

* * * * *